United States Patent
Rau et al.

(10) Patent No.: US 7,408,646 B2
(45) Date of Patent: Aug. 5, 2008

(54) METHOD AND APPARATUS FOR DETERMINING LOCAL VARIATION OF THE REFLECTION OR TRANSMISSION BEHAVIOR OVER A MASK SURFACE

(75) Inventors: Jenspeter Rau, München (DE); Frank-Michael Kamm, Dresden (DE)

(73) Assignee: Infineon Technologies AG, Neubiberg (DE)

(*) Notice: Subject to any disclaimer, the term of this patent is extended or adjusted under 35 U.S.C. 154(b) by 258 days.

(21) Appl. No.: 11/070,290

(22) Filed: Mar. 3, 2005

(65) Prior Publication Data

US 2005/0195414 A1 Sep. 8, 2005

(30) Foreign Application Priority Data

Mar. 3, 2004 (DE) .................. 10 2004 010 363

(51) Int. Cl.
*G01N 21/55* (2006.01)
(52) U.S. Cl. .................... 356/445; 356/239.7
(58) Field of Classification Search ............. 356/445, 356/237.1–237.6, 239.2–239.8, 300–334, 356/128–137; 250/492.2, 492.1–492.3, 306; 430/5, 311
See application file for complete search history.

(56) References Cited

U.S. PATENT DOCUMENTS

| | | | |
|---|---|---|---|
| 4,332,473 A * | 6/1982 | Ono ........................ | 356/509 |
| 5,652,657 A * | 7/1997 | Yoshii et al. .............. | 356/394 |
| 6,555,828 B1 | 4/2003 | Bokor et al. | |
| 6,990,225 B2 * | 1/2006 | Tanaka et al. ............ | 382/144 |
| 2002/0101585 A1 | 8/2002 | Benesch et al. | |
| 2003/0137656 A1 * | 7/2003 | Fuse ........................ | 356/124 |
| 2004/0032581 A1 * | 2/2004 | Nikoonahad et al. ..... | 356/237.2 |
| 2004/0033426 A1 * | 2/2004 | Boef et al ................ | 430/22 |
| 2004/0246476 A1 * | 12/2004 | Bevis et al. .............. | 356/237.5 |

FOREIGN PATENT DOCUMENTS

DE 198024 624 A1 2/1999

OTHER PUBLICATIONS

"Applications of OCD Technology: Critical Dimension Measurements on Photomasks", Mar. 2003, APN-OCD Photomask-R2003MAR, pp. 1-6.

* cited by examiner

*Primary Examiner*—Gregory J. Toatley, Jr.
*Assistant Examiner*—Tri T Ton
(74) *Attorney, Agent, or Firm*—Edell, Shapiro & Finnan, LLC

(57) ABSTRACT

A focused light beam is directed onto a surface patch of a mask and decomposed into partial beams by diffraction at a structure formed on the surface of the mask. Detectors are set such that the intensity of at least two orders of diffraction can be measured. The measured intensities are compared with one another. By way of example, a quotient can be ascertained. The operations are repeated for adjacent surface patches. If the absolute values of the measured intensities fluctuate with a constant quotient, then a variation of the reflection or transmission over the surface of the mask is inferred. If the quotient varies as well, then line width fluctuations within the structure on the mask are inferred.

7 Claims, 3 Drawing Sheets

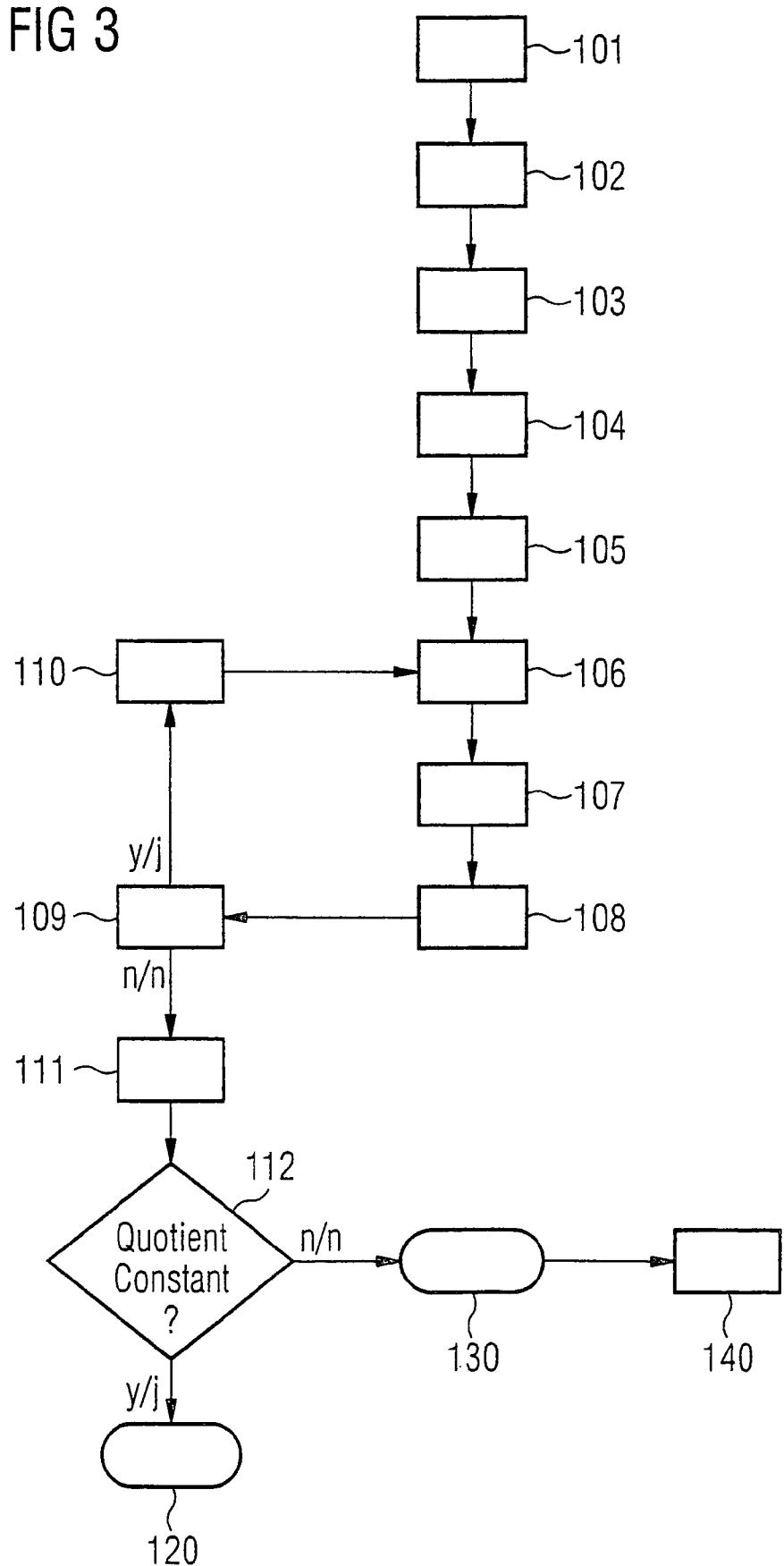

METHOD AND APPARATUS FOR DETERMINING LOCAL VARIATION OF THE REFLECTION OR TRANSMISSION BEHAVIOR OVER A MASK SURFACE

CROSS REFERENCE TO RELATED APPLICATIONS

This application claims priority under 35 USC § 119 to German Application No. DE 10 2004 010 363.1, filed on Mar. 3, 2004, and titled "Method and Measuring Device for Determining a Local Variation of the Reflection or Transmission Behavior Over the Surface of a Mask," the entire contents of which are hereby incorporated by reference.

FIELD OF THE INVENTION

The present invention relates to a method and apparatus for determining a local variation of the reflection or transmission behavior over a mask surface in order to project a structure onto a wafer. In addition, the invention relates to a determination of line width fluctuations of structures on the surface of the mask.

BACKGROUND OF THE INVENTION

In order to fabricate integrated circuits, the structures formed on a mask are transferred, while being projected onto wafers covered with a photosensitive layer. After carrying out a developer step, the image structures formed in the layer on the wafer are transferred, in a further etching step, into an underlying layer that is to be patterned. Conventionally, masks, in which opaque or semitransparent structures are formed on an essentially transparent quartz substrate or similar materials, are used in production. For the projection, radiation is sent through the masks, so that the areas not covered by opaque structures are imaged in the photosensitive layer.

Technologies that are in development and will be used in the near future provide for the use of reflection masks, in particular those which can be used in the extreme ultraviolet (EUV) wavelength range of between 10 and 14 nm exposure wavelength. The reason is that the materials that can be used for mask substrates are no longer transparent in these short wave wavelength ranges. The reflection masks therefore comprise, on the surface of the substrate a reflective layer, typically a layer stack, with an alternating layer sequence of molybdenum and silicon, a buffer layer and also an absorber layer arranged thereon. The reflection masks are irradiated at an angle of incidence that is not perpendicular to the surface, so that the reflection layers uncovered by the removal of absorber layer areas are imaged as structures via a lens system on the wafer.

In the case of reflection masks as well as transmission masks, it is crucial for the imaging quality that the distribution of the reflectivity or transmission over the mask surface is as homogeneous as possible. A locally reduced reflectivity or transmission leads to a weaker through exposure and thus, if appropriate, to a smaller line width of an exposed structure element, at the corresponding location in the photosensitive layer on the wafer. Particularly, in the case of EUV reflection masks, a locally varying reflectivity may have a direct influence on the process window during the imaging onto the wafer. It is necessary, therefore, to solve the problem of a locally varying reflectivity, as well as transmission, as early in the fabrication of the mask or in the development of the fabrication process in order to afford possibilities for avoidance.

It is possible to use fully reflective or transmissive mask substrates where the opaque or absorber layers are completely removed in a test exposure and to evaluate the intensity distribution arising in the image plane of the wafer. As an alternative, it is also possible to measure the reflectivity or transmission at larger open areas of the mask within which no opaque or absorbing structures are provided.

However, variations of the reflectivity or transmission in large, open areas may be very different from those within patterned regions. However, the process window of an imaging is precisely influenced, on the other hand, also by line width fluctuations within the patterned regions. If, moreover, the reflectivity or transmission is also governed by the density of the structures on the mask, then satisfactory conclusions about the influence of reflection or transmission fluctuations are virtually precluded.

The varying etching depth on the mask, for example, being dependent, if appropriate, on the width of a gap in the resist that has been exposed by an electron beam, beforehand in order to form the relevant structure on the mask. A narrower gap width may lead to a lower etching rate and thus to a smaller etching depth. If the opaque or absorber material is to be removed, then residues of the corresponding material may possibly remain on the reflective or transparent layer (substrate) and thus locally influence the reflection or transmission behavior.

Further examples relate to a silicon layer that is locally oxidized during etching, for instance, and is thus subject to increasingly greater absorption, or the formation of thin carbon films on the substrates on account of contamination.

Thus, conclusions about the causes of a line width variation of the image arising on the wafer can be obtained only to a very limited extent by means of conventional measurements of the local variations of reflectivity or transmission. Conversely, if, on account of ascertained line width fluctuations on the wafer, detailed measurements of the line widths of the mask are carried out in a microscope, but the ascertained gap widths exhibit nothing conspicuous, then it is also possible, with difficulty however, to draw conclusions about a varying reflection or transmission behavior as a cause of the fluctuations.

SUMMARY OF THE INVENTION

Accordingly, the invention is based on the issue of being able to determine, with a low outlay, local variations of reflection in the case of reflection masks or transmission in the case of transmission masks. In particular, the present invention provides a method in which the influence of local line width fluctuations can be separated from that of local reflectivity or transmission fluctuations.

The invention comprises a method for determining a local variation of the reflection or transmission behavior over the surface of a mask for the projection of a structure onto a wafer, comprising providing a mask, in a measuring device, employing at least one detector for measuring the intensity of a light beam that is diffracted at the structure on the mask, irradiating the mask with a light beam incident on the structure, so that the light beam is decomposed at the structure into at least two partial beams each representing an order of diffraction, measuring the intensities, in each case, of the first partial beam and of the second partial beam on the basis of the at least one detector, comparing the first intensity with the second intensity, determining a local variation of the reflection or transmission behavior from the result of the comparison.

The transmission mask or reflection mask has a structure on its surface. The structure comprises a multiplicity of structure elements. The structure corresponds to one or a plurality of patterns of a circuit plane for the fabrication of an integrated circuit. In a preferred configuration, the structure has periodically arranged partial patterns.

A light beam is generated and directed onto the mask. The light beam is diffracted at the structures. Consequently, the light beam is decomposed into a number of partial beams each representing an order of diffraction. In the case of transmission masks, the partial beams, are formed after the light beam has passed through the mask; in the case of reflection masks, the partial beams are formed after the beam has emerged onto the surface of the mask. Partial beams of the zeroth order of diffraction pass through the mask without deflection transmission masks or are reflected with an angle of reflection identical to the angle of incidence, in the case of reflection masks. Partial beams which correspond to the higher-orders of diffraction (+/−1, +/−2, . . . ) are in each case deflected or reflected in a direction that differs from the direction of the partial beams of increased order of diffraction.

The intensities of at least two different partial beams are measured by one or more detectors which, by way of example, have been positioned within the beam directions for the partial beams of higher order of diffraction. It is also possible to measure the intensity of the partial beam of zeroth order of diffraction and also of the partial beam with a higher order of diffraction.

The measured intensities of the two partial beams, i.e., of the two orders of diffraction, are compared with one another. The intensities of the two partial beams are in a specific ratio to one another that results from the diffraction signature of the irradiated structure. The diffraction signature depends in particular on the spectrum of the light beam that is radiated in, on the three dimensional profile of the diffracting structure elements, and also on the optical properties of the materials respectively situated at the surface of the structures. In accordance with a preferred configuration, in each case, a limited surface patch on the mask is irradiated progressively. The intensities of the two partial beams are recorded then a variation of these ratios is obtained, if appropriate, for two adjacent surface patches from the comparison result.

If the absolute intensities of both partial beams fluctuate from surface patch to surface patch in the same way, that is to say, if the ratio of the two intensities remains constant, then a change in the reflection behavior or the transmission behavior is inferred according to the invention. This is due to the fact that the reflection/transmission is independent of the structure, and also independent of the diffraction signature and the orders of diffraction.

By contrast, if not only the intensities but also the ratios of the intensities fluctuate with respect to one another, then according to the invention this yields a very clear indication of changes in the structure, i.e. in particular line width fluctuations are also taken into consideration. The comparability presupposes virtually identical structure arrangements within adjacent surface patches.

The comparison of the intensities of the two partial beams, or orders of diffraction, makes it possible, in an advantageous manner, to separate the effect of the varying reflection or transmission behavior from that of the line width fluctuations.

A further advantage arises from the fact that the measurement is based on a measurement method. In particular, the method also applies to reflection masks, but not to wafers, and is supplemented in such a way that, in this case, not only line width fluctuations, but also reflection or transmission fluctuations, can be ascertained.

An analysis of line profiles by means of spectrometers and so-called rigorous coupled wafer analyses (RCWA) is disclosed in the technical notification "Applications of OCD-Technology: Critical dimension measurements on photomasks" from the company Nanometrics Inc., document APN-OCD photomask-R-2003MAR, applications note available on the Internet, March 2003. However, in this case, spectrometry is involved rather than scatterometry. The signal of only one individual partial beam with one order of diffraction is spectrally decomposed and the spectrum obtained is compared with model spectra. By means of the RCWA method, the underlying models for the surface profile of the structure are adapted until a sufficient match between measured and model spectra is obtained. Line width fluctuations can thus be ascertained. Reflection properties of the surface are also taken into account, although only in the context of forming the model spectra as input parameters.

Scatterometry measurements as are provided in the invention can advantageously be carried out with monochromatic light, for example laser light. Spectrum analysis is not necessary.

The diffraction signature comprises an angle-dependent intensity curve of the diffracted partial beams. For the invention, it suffices for only two partial beams to be compared with one another, preferably the intensity maxima of two different orders of diffraction. A detailed result that further supports the comparison can be achieved by measuring further orders of diffraction. It is also possible to record the complete angle dependent profile. Generating a signal with a spectrum of different wavelengths and also corresponding angle dependent evaluation would even lead to a disadvantage on account of the complex stock of data. An advantage of scatterometry is that the angle-dependent intensity profile, i.e., the diffraction signature, unambiguously identifies the properties of the structure examined and can nevertheless be measured relatively rapidly using one or a plurality of detectors, for example.

One embodiment of the invention provides for using the criterion of whether two diffraction maxima fluctuate in the same way or differently, depending on the location on the mask as a basis for deciding whether line width fluctuations or reflectivity/transmission fluctuations are the cause of the imaging behavior on the wafer. Depending on this result, it is possible to implement further measures, for example a determined measurement of the line width in a microscope. As an alternative, in response thereto, it may also be possible to perform an examination of the line widths by spectrometry, as proposed by the company Nanometrics Inc. These examinations, in turn, require more time, and exclusively for the case in which the reflection behavior is not responsible for the line width fluctuations resulting on the wafer. The invention, accordingly, offers a filter for the preselection of masks to be examined in detailed fashion.

A further possibility for a subsequent detailed examination comprises in carrying out a scatterometry in an angle-dependent manner, the diffraction signature being recorded across a large angular range. A precise modeling is carried out by analysis methods and the modeling result is a local surface topography of the mask.

Further advantageous configurations can be gathered from the dependent claims.

An embodiment of the present invention includes a measuring apparatus for determining a local variation of the reflection or transmission behavior over the surface of a mask for the projection of a structure onto a wafer. The apparatus comprises a light source for generating a focused light beam in one direction, so that the latter impinges on a surface patch on the mask, a first mount for the mask, at least one detector for measuring the intensity of at least one partial beam that has emerged from the light beam as a result of diffraction at structures on the mask, a second mount for the detector such that the light beam can be positioned at a variable angle relative to the surface patch, a control unit for moving the first mount or for deflecting the light beam, so that the surface of the mask can be scanned by the impinging light beam, the control unit being connected to the detector.

For the case of scanning the mask surface, according to the invention, provision is made for connecting both the mount of the mask and the mount of the detector in each case to a control unit. The suitable setting of the detector is thereby performed in a manner dependent on the position of the surface patch on the mask. For example, the position of the surface section specifies a specific partial pattern from the structure whose diffraction signature is known. Intensity maxima of individual orders of diffraction can be selected and the corresponding angles can be read out. The detector(s) is then set correspondingly, so that the partial beams representing the orders of diffraction can be measured.

The focused light beam, which may be generated by a laser, for example, has a diameter of 1-300 µm, and preferably 1-100 µm, in accordance with a particularly advantageous configuration, and 1-50 µm. The diameter should be large enough so that a sufficient number of periodic line/gap structures are located with their period within the diameter.

A further, particularly advantageous configuration provides for combining the measuring device according to the invention with a conventional microscope. If, the variation of reflection/transmission is precluded as a cause of an erroneous imaging behavior, then a detailed inspection can be performed immediately afterward by a line width measurement. In particular, the mask need not be removed from the mount and transferred into the microscope measuring device of a further transport system. Rather, the two measuring apparatuses, the measurement chamber and the transport system in one measuring device, share the substrate mount for the mask.

One configuration provides for carrying out the method according to the invention in an integrated manner in a scatterometry measuring device.

DETAILED DESCRIPTION OF THE DRAWINGS

FIG. 3 shows a flow diagram of an exemplary embodiment of the method according to the invention.

DETAILED DESCRIPTION OF THE INVENTION

Figure 1:
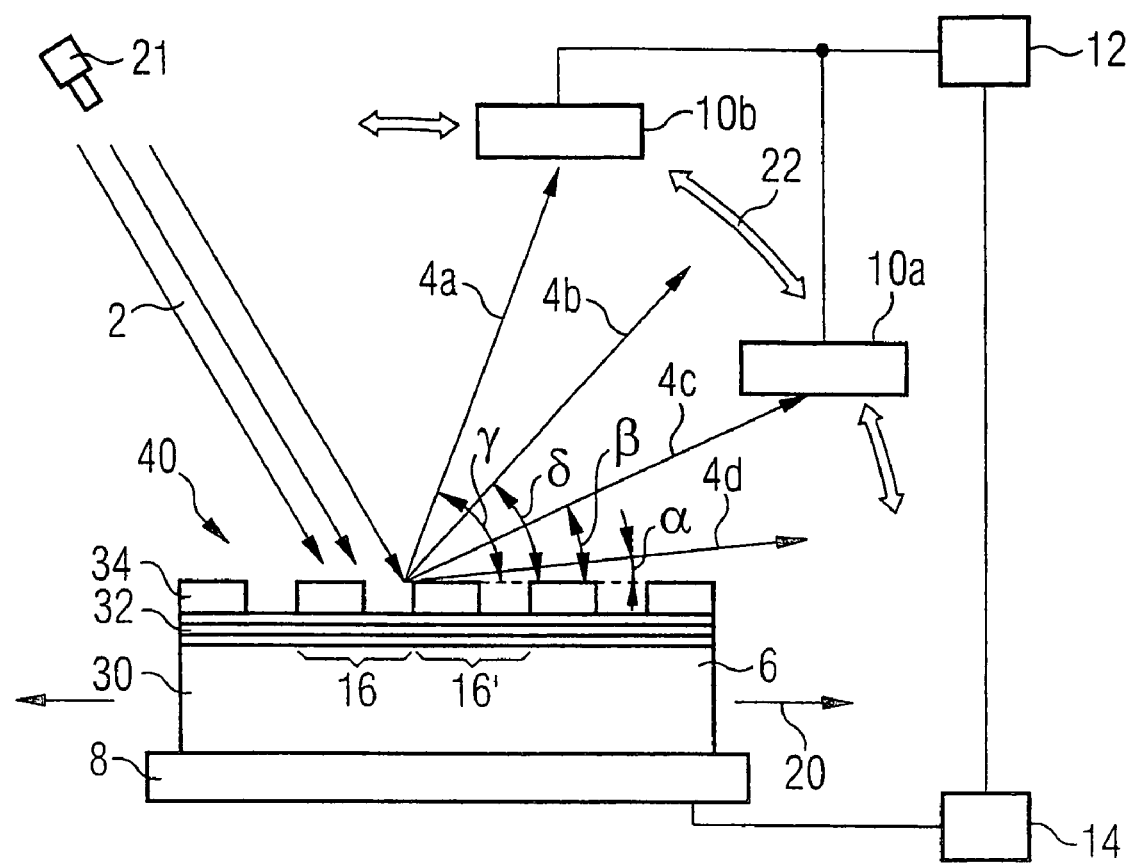
FIG. 1 shows a schematic illustration of an exemplary embodiment according to the invention with a measurement of the reflection behavior.

FIG. 1 shows a schematic illustration of the functioning of the present invention with regard to an EUV reflection mask 6. The reflection mask 6 comprises a substrate 30 made of silicon, a layer stack 32 with an alternating sequence of thin layers made of molybdenum and silicon, which functions as a reflection layer, and also an absorber layer 34, in which a structure 40 is formed.

The EUV reflection mask 6 bears down on a substrate mount 8. The latter can be moved in a direction of movement 20 within the substrate plane with the aid of a motor 14. The motor 14 is driven by a control unit 12.

A light beam 2, preferably a laser beam having a diameter of 20 µm, for example, is projected onto the EUV reflection mask 6 at a non-perpendicular angle. It impinges on the mask within a surface patch 16. The surface patch 16 has the diameter of the light beam 2. The structure 40 formed on the mask comprises a periodic line/gap pattern having a line/gap ratio of 1:1 and a line width of 0.2 µm.

Fifty lines and fifty gaps are thus situated within the irradiated surface patch 16. The light beam 2 is diffracted at the structure 40, i.e. the irradiated partial patch 16. A number of diffracted partial beams 4a-4d arise. The latter are reflected or deflected at different angles δ, γ, β, α relative to the substrate plane. The partial beam 4a represents the zeroth order of diffraction. The partial beams 4b, 4c and 4d represent the first, second and third orders of diffraction, respectively.

Two detectors 10a and 10b have been positioned at an angle β, δ relative to the irradiated surface patch 16 such that they can receive the partial beams 4a and 4c and measure the intensity thereof. The measured values are forwarded to the control unit 12. The control unit 12 can reposition the two detectors 10a, 10b along a direction 22 in accordance with the pattern of the structure 40.

It is also possible to use one detector, for example detector using the motor 14 to cover the entire angular range along the direction 22 while the measurement is simultaneously effected 10a, without moving the mask 6. The angle-dependent diffraction signature is thus obtained. In this case, the partial beams 4a and 4c could be selected during a subsequent analysis in the control unit 12 or computation units connected further downstream.

Figure 2:
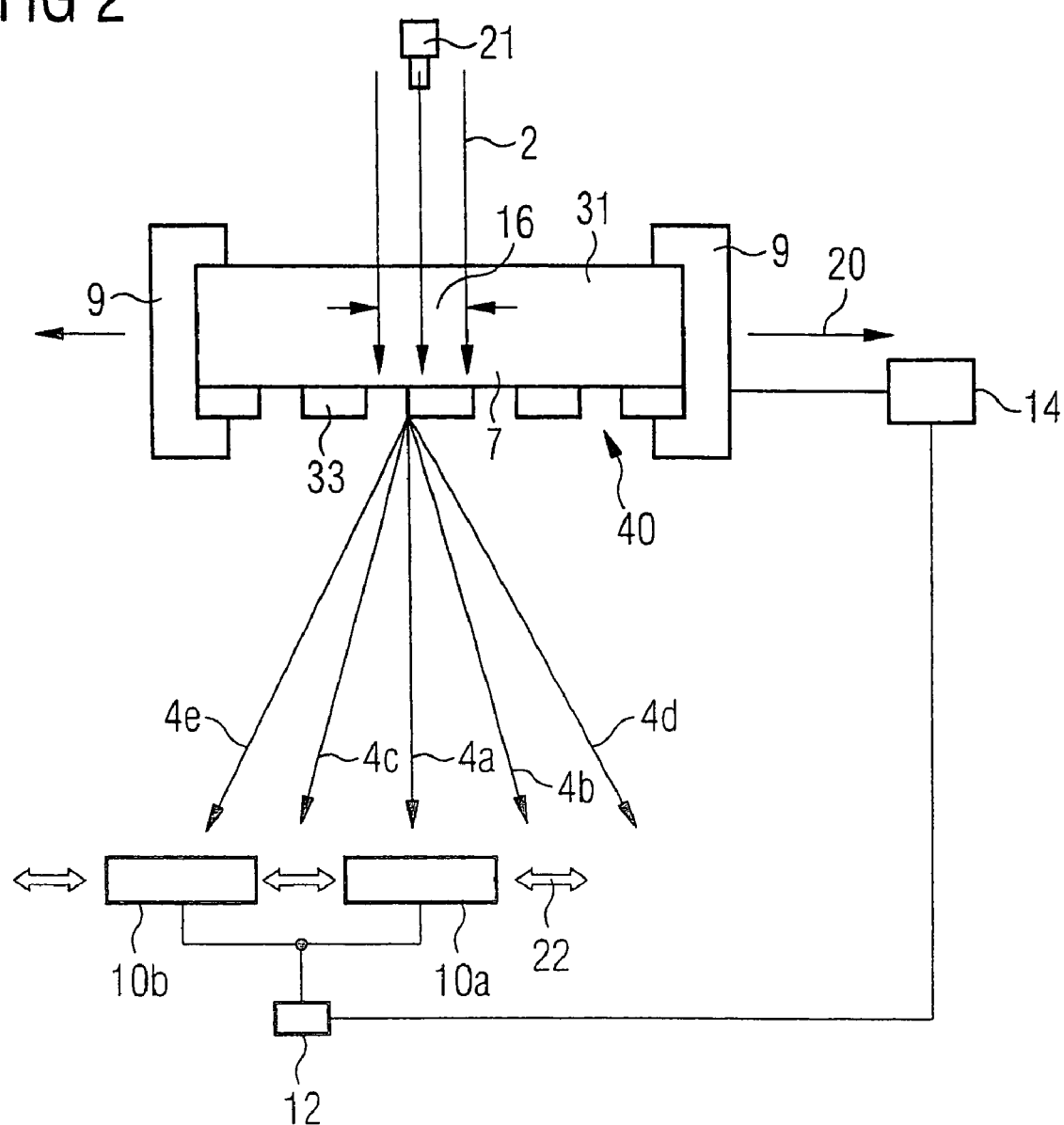
FIG. 2 shows a schematic illustration of an exemplary embodiment according to the invention with a measurement of the transmission behavior.

FIG. 2 shows a similar construction to that in FIG. 1, but for a transmission mask. The substrate mount 9, which holds the transmission mask 7, is moved along a direction of movement 20. The transmission mask 7 has a quartz substrate 31 and opaque structures 33 made of chromium, for example. Since the present invention is provided for high-quality masks having line widths that lie at the resolution limit of currently available projection apparatuses, such as structures 33 formed using phase mask technology is expressly provided. Structures 33 can be formed both using the technology of alternating phase masks including etches into the quartz substrate 31 and in the form of halftone phase masks. Mixed types are likewise provided. The same applies to chromeless phase masks in which no opaque or semitransparent structures at all are established. Transmission masks according to the invention are in particular those which are provided for exposure of a wafer at the wavelength 157 nm or 193 nm.

In the schematic illustration of FIGS. 1 and 2, the widths of the imaged structures in relation to the width or the diameter of the light beams 2 do not correspond to the actual conditions. Typically, between 10 and 1000 of the preferably periodically arranged structure elements fall within the surface patch 16.

In the arrangement illustrated in FIG. 2, the detectors 10a and 10b are positioned by the control unit 12 in such a way that they measure the intensities of the zeroth order of diffraction (partial beam 4a) and the minus second order of diffraction (partial beam 4e).

The sequence of the method according to the invention is illustrated in the flow diagram of FIG. 3. In step 101, the mask 6 or 7 illustrated in FIG. 1 or 2, respectively, is provided in a measuring device and placed onto the mount 8 or 9, respectively. In step 102, a first surface patch 16 to be irradiated is defined within the structure 40. Preferably, the positions of the further scanning points, i.e. further surface patches 16, are also already defined at this location.

In step 103, two orders of diffraction that are to be compared are selected and the two angles β, δ for the detectors 10, 10b are calculated on the basis of the pattern projected into the surface patch 16 to be exposed. In step 104, the detectors 10a, 10b are moved into the corresponding positions via the control unit 12.

It is also possible, as an alternative, first, to scan a large angular range with the detector, in order to subsequently position the latter at precisely that angle which corresponds to the desired order of diffraction, determined experimentally from the recorded signature.

In step 105, the substrate mount 8 or 9 is adjusted using the control unit 12 and the motor 14 in such a way that the light beam 2 falls into the defined surface patch 16.

In step 106, the light beam 2 is generated and, for irradiation of the mask, is projected onto the surface thereof. If appropriate, focusing or beam expansion to the desired diameter, in this case 20 µm, is also carried out.

In step 107, the intensities of the diffracted partial beams 4a and 4c or 4a and 4e are recorded in parallel. The measurement results are forwarded to the control unit 12.

In further step 108, the two intensity values are compared with one another. By way of example, a quotient is calculated from the two intensities and the quotient is stored.

In step 109, a determination is made as to whether further scanning points are to be moved too. If this is the case, then, in a further step 110, the mount 8 or 9 is moved by 20 to 30 µm, for example, by the motor 14, so that an adjacent surface patch 16' can be irradiated by the light beam 2. Steps 106 to 109 are repeated for the corresponding scanning point. If that holds true for a multiplicity of scanning points, then a map of the structure 40 is obtained, in which there is a quotient for the intensities made up of the zeroth and second orders of diffraction for each position, as defined in step 102.

In an analysis step 111, adjacent quotients can be compared with one another, thereby obtaining local variations for the quotients in a high-resolution fashion in this case 20 µm. If the quotients are constant, for example across wide ranges of scanning points or surface patches, then the presence of reflectivity or transmission fluctuations emerges as a result 120 from the criterion 112 (constancy: yes/no), insofar as there are fluctuations in the absolute values for the scanning points.

By contrast, if constancy is not present, then this is an indication of changed diffraction signatures and, as a result, also of fluctuations in the line widths, result 130. On account of the result 130, a detailed line width measurement 140 is instigated in a high-resolution microscope, a CD measuring device, an SEM (Scanning Electron Microscope), an Atomic Force Microscope (AFM), a scatterometer or a spectrometry method, etc.

LIST OF REFERENCE SYMBOLS

2 Light beam
4a-4e Diffracted partial beams
6 EUV reflection mask
7 DUV/FUV transmission mask
8 Mask mount
10a, 10b Detectors
12 Control unit
14 Motor
16, 16' Surface patch
20 Direction of movement of the mask mount
22 Direction of movement for angular setting of the detectors
30 Mask substrate for reflection mask
31 Mask substrate for transmission mask
32 Reflection layer
33 Opaque or semitransparent layer
34 Absorber layer
40 Structure
101 Provision
102 Definition of the first surface patch
103 Selection of orders of diffraction
104 Setting of the detector angles
105 Adjustment of the mask mount
106 Generation of a light beam and irradiation of the mask
107 Measurement of the intensities
108 Comparison of the measured intensities, determination of the quotient
109 Decision for further surface patches
110 Adjustment of a further surface patch
111 Comparison of adjacent quotients
112 Criterion: reflection/transmission or line width fluctuation?
120 Result: reflection/transmission fluctuation
130 Result: line width fluctuation
140 Detailed line width measurement

What is claimed is:

1. A method for determining a local variation of reflection or transmission behavior over a surface of a mask for projecting a structure onto a wafer, comprising:
    providing the mask in a measuring device including at least one detector for measuring the intensity of a light beam that is diffracted at the structure on the mask;
    irradiating the mask with a light beam incident on the structure, so that the light beam is decomposed at the structure into at least two partial beams each representing an order of diffraction;
    measuring intensities of a first of the partial beams and of a second of the partial beams on the basis of the at least one detector;
    comparing the first intensity with the second intensity;
    determining a local variation of the reflection or transmission behavior over a surface of the mask from a result of the comparison for projecting the structure onto a wafer;
    setting the light beam to impinge on a surface patch of the mask in which portions of the structure to be projected are formed; and
    determining a local fluctuation of a line width,
    wherein the line width is measured with a high resolution microscope in a manner dependent on the determined fluctuation of the line width for at least one of the surface patches.

2. The method as claimed in claim 1, wherein the comparing step further comprises:
    determining the ratio of the first intensity to the second intensity;
    predefining a reference value; and
    comparing the ratio with the reference value.

3. The method as claimed in claim 1, further comprising:
    focusing the light beam to the size of a surface patch of the mask;
    moving the mask with the structure relative to the light beam so that the light beam scans a number of surface patches on the mask;
    determining values of the reflection or the transmission for each of the surface patches; and
    calculating the variation of the reflection or transmission behavior by a further comparison between the reflection or transmission values ascertained for each of the surface patches.

4. The method as claimed in claim 1, wherein the high-resolution microscope comprises: a scanning electron microscope, an atomic force microscope, a microscope usable in the optical or UV wavelength range, or a microscope usable in a scatterometer or in a spectrometry method.

5. The method as claimed in claim 1, wherein the mask comprises an EUV reflection mask.

6. The method as claimed in claim 1, wherein the mask comprises a transmission mask operational at projection wavelengths of 157 nm or 193 nm.

7. A method as claimed in claim 1, wherein the measuring device comprises a device for angle dependent measurement of the diffraction of structures.

* * * * *